United States Patent [19]

Morgan

[11] Patent Number: 4,931,479
[45] Date of Patent: Jun. 5, 1990

[54] FOAM IN PLACE CONDUCTIVE POLYURETHANE FOAM

[75] Inventor: Noredin H. Morgan, Billerica, Mass.

[73] Assignee: Chomerics, Inc., Woburn, Mass.

[21] Appl. No.: 267,599

[22] Filed: Nov. 7, 1988

[51] Int. Cl.$^5$ .............................................. C08G 18/14
[52] U.S. Cl. ..................................... 521/76; 252/512; 252/514; 521/99
[58] Field of Search ........................... 521/76, 99, 123; 252/514, 512

[56] References Cited

U.S. PATENT DOCUMENTS

| | | | |
|---|---|---|---|
| 2,917,384 | 12/1959 | Grandey | 419/14 |
| 3,075,925 | 1/1963 | Dunegan | 252/478 |
| 3,441,523 | 4/1969 | Dwyer et al. | 521/120 |
| 3,446,906 | 5/1969 | Zulauf | 174/35 |
| 3,499,848 | 3/1970 | Weisman | 521/172 |
| 3,640,920 | 2/1972 | Cear | 521/174 |
| 3,644,236 | 2/1972 | Macoustra | 521/155 |
| 3,753,933 | 8/1973 | Olstowski | 521/170 |
| 4,067,831 | 1/1978 | Wasilczyk | 521/128 |
| 4,098,945 | 7/1978 | Oehmke | 428/327 |
| 4,123,599 | 10/1978 | Hilterhaus et al. | 521/123 |
| 4,158,031 | 6/1979 | Reuter et al. | 521/57 |
| 4,231,901 | 11/1980 | Berbeco | 252/511 |
| 4,301,040 | 11/1981 | Berbeco | 252/511 |
| 4,367,259 | 1/1983 | Fulmer et al. | 428/240 |
| 4,493,788 | 1/1985 | Fujie et al. | 252/511 |
| 4,496,627 | 1/1985 | Azuma et al. | 428/336 |
| 4,505,973 | 3/1985 | Neet et al. | 428/317.9 |
| 4,525,297 | 6/1985 | Yamane et al. | 252/511 |
| 4,581,158 | 4/1986 | Lin | 252/511 |
| 4,621,106 | 11/1986 | Fracalossi et al. | 521/130 |
| 4,687,553 | 8/1987 | Solomon et al. | 204/16 |
| 4,698,369 | 10/1987 | Bell | 521/99 |
| 4,712,674 | 12/1987 | Young | 206/328 |
| 4,719,039 | 1/1988 | Leonardi | 252/511 |
| 4,722,025 | 1/1988 | Robinson | 361/212 |
| 4,824,871 | 4/1989 | Shinomura | 521/53 |

FOREIGN PATENT DOCUMENTS

| | | |
|---|---|---|
| 026920 | 10/1979 | European Pat. Off. . |
| 209395 | 7/1986 | European Pat. Off. . |
| 0248602 | 5/1987 | European Pat. Off. . |
| 126557 | 9/1975 | German Democratic Rep. . |
| 1109095 | 4/1968 | United Kingdom . |

OTHER PUBLICATIONS

Patent Abstracts of Japan, vol. 8, No. 193, Sep. 5, 1984, Kokai No. 59-84914.
Patent Abstracts of Japan, vol. 9, No. 25, May 3, 1985, Kokai No. 60-11519.
European Patent Application #87304756.7, Kleitz et al.

Primary Examiner—Maurice J. Welsh
Attorney, Agent, or Firm—John D. Hubbard; William L. Baker

[57] ABSTRACT

An electrically conductive elastomeric foam for use in EMI/RFI shielding applications, especially as a gap filler or caulk. The foam is based upon a polyurethane system wherein the electrically conductive filler is intermixed with either the isocyanate or active hydrogen containing component before reacting the two components to create the foam. The foam is lightweight, flexible, highly conductive, capable of withstanding cyclical vibration and is capable of adhering to various conductive surfaces such as metal, composites and glass. The foam is preferably room temperature curable and consists of a water activable prepolymer or quasi prepolymer system.

24 Claims, No Drawings

FOAM IN PLACE CONDUCTIVE POLYURETHANE FOAM

The present invention relates to a conductive elastomeric foam. More particularly, it relates to a polyurethane foam useful as a conductive gap filler that is room temperature curable and capable of being formed in place.

BACKGROUND OF THE INVENTION

The suppression or elimination of EMI/RFI energy has become increasingly important in the past few years. The advent of smaller, more powerful electronic equipment has increased the potential for EMI/RFI interference and its damaging effects.

One area of EMI/RFI shielding that has been largely ignored is the shielding of large or irregular gaps. Such gaps are formed between adjacent structural components such as between a wall of an EMI/RFI enclosure and its shielded door or window frame, between a cable or power supply conduit and an opening in a wall or between a cover and a closure.

Generally, the approach has been to eliminate such gaps altogether by requiring closer tolerances between adjacent parts or redesigning the structures to eliminate the problem. Those gaps which cannot be eliminated have been covered by conductive metal plates or tapes or filled with solid conductive materials, such as conductive caulks and potting compounds.

While the above remedies work to some degree, they are expensive, cumbersome and do not always provide a complete shield. For example, requiring closer tolerances between components reduces the ability to interchange components and adds to the cost of manufacturing. Redesigning of components causes delays and often creates new EMI/RFI problems. Metal plates or tapes are often unsightly and generally do not provide a flexible, maintenance free solution. The existing caulks and potting compounds are expensive to use in that a large volume of material is needed to form a complete EMI/RFI shield, and are generally rigid and inflexible.

The need exists for an easy to apply, inexpensive, conductive material for irregular or large gaps which provides a complete EMI/RFI shield. Additionally, a need exists for such a material that is also flexible and capable of being cured or molded in place at room temperature.

OBJECTS AND SUMMARY OF THE INVENTION

The present invention provides a conductive foam that is easy to apply, flexible and capable of being cured or molded in place. The present invention provides such a foam through the use of a conductive polyurethane foam that can be formed in place.

It is an object of the present invention to provide an electrically conductive elastomeric foam which is capable of being formed in place at room temperature.

It is a further object of the present invention to provide an electrically conductive polyurethane foam comprised of an isocyanate containing component and an active hydrogen containing component, wherein the active hydrogen containing component has one or more conductive fillers dispersed therein.

It is another object of the present invention to provide an electrically conductive flexible foam comprised of an isocyanate terminated prepolymer and a polyol as the source of the active hydrogen wherein the polyol has one or more conductive fillers dispersed therein.

An additional object of the present invention is to provide a process for filling a gap between conductive surfaces for EMI/RFI shielding applications comprising the steps of reacting an isocyanate containing component with an active hydrogen containing component having one or more conductive fillers therein so as to create a polyurethane foam structure, placing the uncured polyurethane foam within the gap and allowing the components to cure and crosslink in place.

An additional object of the present invention is to provide a conductive polyurethane foam useful in filling gaps or cavities between two surfaces which must be electrically continuous.

A further object of the present invention is to provide an elastomeric conductive foam capable of being formed in a structural gap, which conductive foam exhibits good electrical conductivity and continuity characteristics.

Another object of the present invention is to provide an elastomeric conductive foam comprised of a polyurethane foam having one or more electrically conductive fillers dispersed throughout the foam and wherein the foam is used as an EMI/RFI gasket or shield.

These and other objects of the present invention will be made clear from the specification and appended claims.

DETAILED DESCRIPTION OF THE INVENTION

The present invention is directed to conductive elastomeric foams, preferably polyurethane foams, their formation and use. The conductive foams preferably have the ability to react, cure and crosslink at room temperature and at such a rate that they may be formed in place.

The preferred elastomeric foam is based upon a polyurethane system. Polyurethanes are preferred for a number of reasons. Polyurethane chemistry is well known and the resultant foam can be easily manipulated to suit one's end use requirements, e,g., foam height, foam density, foam strength, foam structure, etc. Polyurethane foams can be easily formed in the field due in part to the development of water activated polyurethane foams. Additionally, these foams can be made at room temperature, eliminating the need for ovens or high temperatures to cure the foam. Such foams can withstand a wide range of temperature fluctuations, e.g., $-80°$ F. to $+200°$ F. Polyurethane foams can retain large loadings of fillers without significantly affecting their structural characteristics and exhibit excellent adhesive properties to a wide variety of surfaces. Further, polyurethane foams are not created until the required ingredients are mixed. Thus, one can easily form a two, three, four or more component system that is activateable when and where desired. Lastly, such foams can be "self-foaming" such that one does not need to use external temperature activated foaming agents or solvents in order to create such foams.

Basically, polyurethane foam systems contain two reactive components, an isocyanate component and an active hydrogen containing component. The chemistry of polyurethane foam formation involves three reactions which occur essentially at the same time, though at different rates. The three reactions are chain extension, gas generation and crosslinking.

The chain extension is the primary reaction of the three reactions. It basically involves the reaction of the isocyanate group with an active hydrogen group to form a urethane linkage. A byproduct of the reaction is heat:

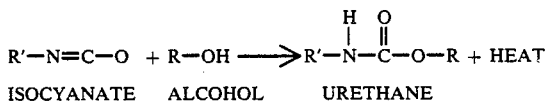

The urethane can then react with additional isocyanate groups to form an allophanate, as shown below:

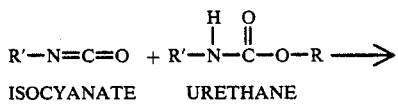

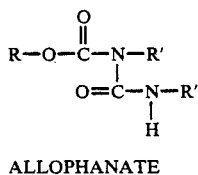

ALLOPHANATE

Gas generation involves the reaction of the isocyanate with water to form an unstable carbamic acid which through the aid of an amine catalyst forms an aromatic amine and the generation of carbon dioxide gas:

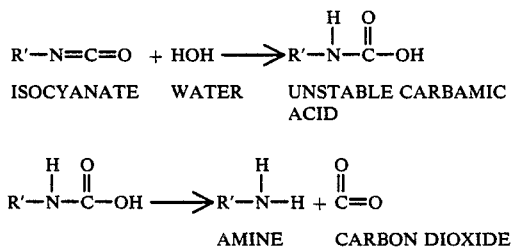

Crosslinking is caused by the reaction of the amine formed during gas generation with isocyanate to form an urea which crosslinks the urethane polymer. The crosslinking also traps the carbon dioxide gas within the polyurethane structure, thus creating the foam system:

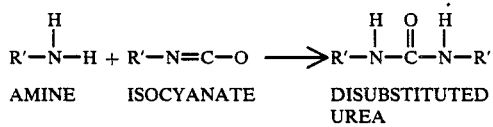

Lastly, depending upon the amount of urea and free isocyanate, some of the urea may react with isocyanate to form a highly crosslinked biuret:

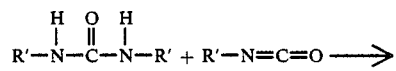

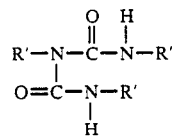

The result of the three reactions is the formation of a crosslinked polyurethane structure containing numerous pockets formed by the generation and trapping of the carbon dioxide gas.

While the above reactions are shown with the active hydrogen group being a hydroxyl group (OH), it should be clear that other hydrogen containing groups can also be used in the above reactions.

Foam characteristics can be controlled during the reactions through the proper use of temperature, catalysts and the amount of free isocyanate.

Polyurethane foams are generally prepared by one of three different methods, all of which are suitable for use in the present invention.

The first method is to use a isocyanate terminated or capped polyol, commonly known as a prepolymer. In such prepolymers, all of the polyol has been pre-reacted with isocyanate. The prepolymer is foamed with the addition of an active hydrogen containing component, typically water, alcohol or a mixture thereof. Such a system is desirable in that the foaming may be carried out at room temperature and that an exact balance of isocyanate to active hydrogen groups is not necessary. In fact, some prepolymers allow one to use an excess amount of active hydrogen containing component without adversely affecting the foam formation.

The second method is to use quasi-prepolymers to create a polyurethane foam. Quasi-prepolymers are polyol systems wherein only a portion of the polyol to be used in making the foam is pre-reacted with some of the available isocyanate to form an isocyanate terminated prepolymer. The remaining polyol, an active hydrogen containing component, and any catalysts that may be desired are then mixed together with the quasi-prepolymer to create a polyurethane foam. The quasi-prepolymer method allows one to vary the resultant foam characteristics through the use of different polyols, or elastomeric polymers, etc. This method is desirable in that it generally provides lighter density, more resilient and elastomeric foams than are available with the prepolymer method.

The last and more commonly used method is known as the one shot method. In this method, an isocyanate component and an active hydrogen containing component, typically a polyol, are blended with a small amount of water to create a polyurethane foam.

Suitable isocyanate terminated prepolymers are well known and commercially available. It is preferred that the prepolymer system be formed from a polyester polyol or a polyether polyol. More preferably, a polyether polyol is the selected prepolymer due to the flexibility it imparts to the foam.

Preferred polyether polyols used for the isocyanate terminated prepolymers include for example an alkylene oxide adduct of a polyhydric alcohol, such as propylene oxide, ethylene oxide, 1,2-butylene oxide or a mixture of some or all of these.

Suitable commercially available isocyanate terminated prepolymers useful in this invention. Examples of such include, but are not limited to HYPOL ® prepolymers from W. R. Grace & Co.-Conn., MX100 prepolymers from Sartomer Corporation, URIC N2023 prepolymers from Aceto Corporation, SUCRANOL prepolymers from Sodethane, and PURACOL C-133 grafted prepolymers from BASF.

The quasi-prepolymers suitable for use in the invention may be based upon the same polyols discussed above in regard to the isocyanate terminated prepolymers. Additionally, the quasi-prepolymers may contain different polyols or other polymeric constituents such as various rubbers and other elastomeric polymers.

The prepolymers or quasi-prepolymers are activated by an active hydrogen containing component, such as water, alcohols, amines, polyols or a mixture thereof. Preferably, the active hydrogen component is based upon a hydroxyl group (OH).

When the more traditional urethane system is used, the preferred isocyanates include crude isocyanates, aromatic polyisocyanates and aliphatic and cycloaliphatic polyisocyanates. It is preferred to use aromatic polyisocyanates in the present invention and in particular methylene di-p-phenylene isocyanate (MDI) and toluene diisocyanate (TDI). Such polyisocyanates are commercially available under the brand names BERONAT, available from Berol, CARADATE from Shell, ISOCON from Lankro, and DESMODUR ® available from Bayer A.G.

The active hydrogen containing component is generally a hydroxyl group containing polyol. Such polyols are well known and commercially available. Preferred polyols useful in the present invention include polybutuadienes, such as hydroxyl group terminated polymers of butadiene; various drying oils, such as, polymerized castor oils; polyesters and polyethers. These types of polyols are commercially available, for example as Poly bd ® resins (hydroxyl terminated butadienes) available from Sartomer Co., POLYCASTER ® polymerized castor oils available from Aceto Corporation DESMOPHEN ® resins available from Bayer A.G. Other active hydrogen containing components can also be used and are commercially available, such as JEFFAMINE ® amine polyols available from Jefferson.

In any of these urethane systems, additional water or alcohol can be added to the system to vary the foam's characteristics such as cell count, size and structure (i.e. open or closed cells).

Additionally, one may add one or more additional polyols to the system or add different polymers, such as various elastomeric latices, to vary the foam's structural characteristics. If such a component is added, it is preferred that it be added with the active hydrogen containing component.

One or more catalysts for controlling the rate of the reaction of the polyurethane foam may also be used in the present invention. Such catalysts are well known in urethane chemistry and are readily available. Generally, two catalysts are used in polyurethane foams; an amine catalyst for controlling the gas formation reaction and a tin or other metal type of catalyst for controlling the chain extension reaction. Often these catalysts are included in the prepackaged urethane components. Suitable amine catalysts include for example tertiary amines. The tin or other metal catalysts include for example, various stannous octoate, zinc octoate, cobalt naphthenate, pyridinum dodecylbenzene sulfonate, anilinum trifluoromethane sulfonate and mixtures thereof. Suitable amine catalysts include THANCAT from Jefferson Chemical Co. and PROPAMINE from LanKro. Suitable tin catalysts include STANCLERE from Interstab, and CARSTAN from Cincinnati-Milicron. The total amount of catalyst included in the polyurethane foam should be from about 0.01 to about 4 parts by weight per 100 parts polyol. Preferably, the amount of amine catalyst is from about 0.1 to 1 parts by weight per 100 parts polyol and the amount of tin or other metal catalyst is from about 0.1 to 0.5 parts by weight per 100 parts by weight of polyol.

One or more surfactants may be added to either the isocyanate containing component or the active hydrogen containing component to aid in controlling the cell structure, cell count, foam rise, foam height, resiliency and surface energy, i.e.. hydrophobicity or hydrophilicity, of the foam. Suitable surfactants are well known and preferably are silicone based surfactants. The chosen surfactant may be ionic, anionic, nonionic or amphoteric depending upon the foam properties desired. The amount of surfactant added should be from about 0.8 to about 2.5 parts by weight per 100 parts by weight of polyol.

Suitable surfactants include but are not limited to PLURONIC L-62 or PLURONIC P65, available from BASF Wyandotte, BRIJ 72 available from ICI, and Dow 198 available from the Dow Chemical Co.

One or more electrically conductive fillers are used in the present invention. Examples of electrically conductive fillers include noble metals such as silver or gold; noble metal plated metals such as silver plated gold, copper, nickel or aluminum or palladium plated platinum, noble metal plated glass, plastic or ceramics such as silver plated glass microspheres, silver plated alumina or silver plated plastic microspheres; base metals, per se, such as copper, nickel or aluminum; noble metal plated mica; various metal alloy fillers such as ferro alloys; carbon black; and other such conductive fillers.

The shape and size of the fillers is not critical to the present invention. The fillers may be of any shape that is generally used in the manufacture of conductive materials, including spherical, flake, platelet, irregular or fibrous (such as chopped fibers). It is preferred that the conductive filler be in the flake form as it tends to disperse more evenly throughout the foam. The flake form is also desirable in that it is lightweight, has a large surface area and therefore provides excellent conductivity without collapsing the foam and at lower loadings than the other shapes.

The size of the fillers can be within the range normally used for fillers in conductive materials. Preferably, the size of the one or more fillers is from about 1 micron to about 70 microns, preferably from about 3 to about 25 microns and more preferably from about 3 to about 10 microns.

The amount of one or more electrically conductive fillers used in the present invention can vary over a wide range. Preferably, the fillers comprise from about 40 parts by weight per 100 parts by weight of polyol to about 150 parts by weight per 100 parts by weight of polyol. More preferably, the fillers comprise from about 60 to about 85 parts by weight per 100 parts by weight of polyol. More preferably, the fillers comprise about 70 parts by weight per 100 parts by weight of polyol.

Other fillers may also be added to the foam if desired. Such fillers include microwave absorbing materials, thermally conductive fillers, inert fillers and pigmentation fillers.

Useful microwave absorbing fillers include carbon black, carbon fibers, graphite, magnetic ferrites and the like.

Examples of useful thermally conductive fillers include aluminum oxide, aluminum nitride, boron nitride, magnesium oxide and the like.

Suitable inert (bulk) and coloration fillers include talc, gypsum, titanium dioxide and various other well known pigments.

The amount of these additional fillers can vary over a wide range so long as they do not interfere with the electrical conductivity of the foam. Generally, the additional fillers if used, should comprise from about 1 to about 40 parts by weight per 100 parts by weight of polyol. The shape and size of the additional fillers can be similar to those described above in relation to the electrically conductive fillers.

Other components typically used in polyurethane foams may, if desired, be added to the foams of the present invention. Such common components include, for example, flame retardants, foam stabilizers and antioxidants. The amounts of these components in the foam is generally from about 0.1 to 3 parts by weight per 100 parts by weight of polyol, though additional amounts can be added to obtain specific characteristics from the foam.

According to one preferred embodiment of the present invention, the conductive foam may be formed by a "one shot" method in which all of the components are simultaneously mixed with each other, placed in the desired location such as a mold, a flat sheet or in a specific cavity or gap and allowed to react and cure.

Other typical methods of creating polyurethane foams may also be used in creating the foam of the present invention. For example, the components may be blended in an extruder and formed into specific shapes. Likewise, the components can be added consecutively to a mixer, blended and then poured into the final place before the reaction is complete. Additionally, as discussed above, some of the components can be premixed with each other, such as the filler and the active hydrogen containing component or the isocyanate and surfactant and then these premixed blends can be combined to initiate the reaction.

One preferred embodiment of the present invention is formed from a two part system. The first part contains the isocyanate component. The second part contains the active hydrogen component. Additionally, each part, i.e., the isocyanate component and the active hydrogen component, contains one or more additional ingredients useful in the foam. For example, the isocyanate containing part also contains a silicone surfactant. The active hydrogen containing part also contains the one or more electrically conductive fillers, any additional fillers, the one or more catalysts, water, alcohol and/or polyol and any other component. The use of a two-part system which reacts to create a conductive polyurethane foam only upon mixing is desirable in that it allows one to use only that amount of polyurethane foam when and where it is needed. For example, one may use such a system to create a conductive polyurethane foam in the field such as on a repair of a door frame to enclosure wall, or in sealing off power and other supply conduits into such an enclosure.

Preferably the conductive foam of the present invention is room temperature cureable so that the use of heat or other types of curing mechanisms are not required. This also allows one enormous flexibility in forming such foams when and where needed. Of course, if desired one may use heat or other types of curing sources with such polyurethane foams.

The polyurethane foam may be either hydrophobic or hydrophilic in nature. It is preferred that the selected foam be hydrophobic in nature so that moisture will not interfere with the conductivity of the foam. However, hydrophilic foams can be useful where moisture is not a problem such as indoors where the climate is controlled by heating and cooling systems or in those applications where high conductivity or corrosion resistance is not required.

The resultant foam is preferably flexible so that it may be used in applications where cyclic vibration may occur e.g. shipboard or airborne applications. However, another preferred embodiment of the invention is a rigid foam. Rigid foams generally have been found to be more conductive (i.e. lower resistance values) than flexible foams. Therefore, when conductivity is critical a rigid foam may be preferred.

A preferred foam of the present invention should be capable of withstanding at least one thousand (1,000) cycles or more of elongation and compression (at 7% deflection and elongation and 5 cycles/second) with little or no reduction in conductivity. The elongation/compression test is preferably made on a piece of foam approximately 0.65 inches wide and 1 inch long. The foam is attached to a suitable reciprocating device for causing an elongation and compression of the foam. Additionally it is preferred that the foam have high resilience properties so that it will not suffer from compression set and remain flexible.

The conductive foam of the present invention should have the following characteristics: It should have a density of from about 1 g/cc to about 10 g/cc. The durometer of the foam should range from about 8 to about 80 (Shore A hardness). The volume resistivity should be below 10 ohms.cm. Preferably the volume resistivity is from about 0.0017 to about 9.5 ohms.cm. Likewise, the surface resistivity should be less than 7 ohms/cm$^2$. Preferably, the surface resistivity should be from about 0.01 to about 6.5 ohms/cm$^2$.

Additionally, the expansion rate and/or rise of the foam should be from about 1.2 to about 3 times the initial volume of the components, though higher rates of expansion and/or rise could be used if desired.

The ratio of isocyanate to active hydrogen in foams of the present invention can vary over a wide range. This ratio is normally stated as the isocyanate index which defines the amount of isocyanate groups to active hydrogen or hydroxyl groups in a given system. The index is generally represented by a value that expresses the amount of isocyanate to active hydrogen. For example, an index value of 1 means that there is equivalent weight of isocyanate for every equivalent weight of active hydrogen. Changing the ratio between the isocyanate and active hydrogen groups has been found to cause a change in the characteristics of the foam, in particular durometer, compression, elongation, and conductivity. As the isocyanate index value increases, the values for the durometer and conductivity increase, while the values for the compression and elongation characteristics decrease. Conversely, as the index value decreases, there is a decrease in the values of durometer and conductivity and an increase in the values for compression and elongation.

The preferred isocyanate index value of foams made in the present invention ranges from about 0.7 to about 1.3, more preferably, the index value is about 0.9 to about 1.2 and most preferably about 1. This range of index value provides a flexible, resilient foam with a moderate durometer and good electrical conductivity.

It is preferred that the isocyanate component used in the present invention be part of either a prepolymer or quasi-prepolymer. This avoids the necessity of having to handle, transport or store pure isocyanate, which is a well known hazardous material.

In those instances when the isocyanate component is bound up with a prepolymer or quasi-prepolymer, the amount of "free" isocyanate available from the prepolymer or quasi-prepolymer should be about 15% and the amount of prepolymer or quasi-prepolymer used in the foam should be from about 40 to about 60 parts by weight per 100 parts by weight of polyol.

The following is an example of a preferred conductive polyurethane foam of the present invention.

EXAMPLE

A conductive polyurethane foam according to the present invention was prepared from the following components (measured in parts by weight):

| | |
|---|---|
| Polycastor 30 polyol | 9.96 |
| Uric N-2023 prepolymer | 11.15 |
| Uric Y-746 polyol | 6.61 |
| T-12 (100%) tin catalyst | .03 |
| Triethanolamine catalyst | .16 |
| Pluronic L-62 surfactant | .32 |
| Water | 1.27 |
| Fujicura Cu-CP10 copper particles (3-10 micron avg. size) | 65.96 |
| Methyl ethyl ketone | 4.54 |

The resultant foam was molded into a bun about 2 inches in height and 2½ inches in width. The foam had a smooth, substantially flat skin on its outer surfaces. The density of the foam was 2.62 g/cc. Additionally, the foam required an application of 2.5 lbs of force to achieve a deflection of 25%. Initial volume resistivity was about 0.9 ohms/cm, while initial surface resistivity was about 0.1 ohms/cm$^2$. After subjecting the foam to 6000 cycles (5 cycles/second) of an elongation/ compression test (at 7% elongation and compression) the volume resistivity was 5 ohms.cm and the surface resistivity reading was about 3 ohms/cm$^2$.

A 30 mil thick sheet was also formed from the material of the Example. This sheet had a volume resistivity of 0.05 to about 0.1 ohm.cm and a surface resistivity of about 1 ohm/cm$^2$.

Foams made in accordance with the present invention have a wide variety of useful applications.

For example, a gap between a door frame and a wall of a shielded enclosure may be filled with the combined components in an amount such that after curing in place, the foam substantially fills that gap. The foam, being of polyurethane, will strongly adhere to the bottom and sides of the gap and will therefore remain in place.

Another example of a typical use for the present polyurethane foam is as a permanent conductive caulk or seal between surfaces which do not require frequent removal. Such surfaces can include covers on electrical supplies, and gaps in conductive enclosures such as between the enclosure wall and a power supply conduit. The conductive foam will substantially fill the gap and provide a permanent flexible seal between the two surfaces.

Additionally, the foam can be made in molds having desired, preselected shapes, so as to form flat sheets, pyramidal cones, cylindrical tubes, rectangular strips, concave or convex sheets, etc. which can then be inserted into or over the gap or opening to form a conductive pathway between the adjoining surfaces. Likewise, these molded products can be used as EMI/RFI gaskets, per se, instead of the more traditional filled silicone gaskets. If desired, a wire mesh may be placed around the shaped foam to form a resilient conductive wire mesh gasket.

It should be made clear that the electrically conductive filler or fillers are contained within either the isocyanate component or active hydrogen component, preferably the latter, such that when the foam is created, the filler or fillers are fixed in place and form a conductive network throughout the foam. By incorporating the electrically conductive filler or fillers into one of the reactive components, one ensures that the fillers will be evenly and thoroughly dispersed throughout the foam. It is believed that this feature is a major advantage to the present foam and is responsible, at least in part, for the excellent conductivity values exhibited by the foams of the present invention.

The invention of the present application provides many advantages that are readily appreciated by one skilled in the art. The conductive polyurethane foam provides more coverage at less cost than traditional conductive caulks or potting compounds. It also provides an easy and inexpensive means for filling an irregularly shaped or large gap with a flexible conductive material that conforms and bonds to the gap. Additionally, it provides a conductive material which has a smooth outer skin that does not slump or crack when compressed or elongated. Lastly, it provides a means by which a conductive material can be formed where and when it is desired through the use of a prepackaged two, three, four or more part system. All one needs to do is blend the components together, place them in the desired location and allow the system to cure.

While the present invention has been described in relation to its preferred embodiment as a gap or cavity filler, it is clear that it can be used in other EMI/RFI applications, where flexibility, adaptability and electrical continuity are required or desired.

Further, while this invention has been described with reference to its preferred embodiments, other embodiments can achieve the same results. Variations and modifications of the present invention will be obvious to those skilled in the art and it is intended to cover in the appended claims all such modifications and equivalents as fall within the true spirit and scope of this invention.

What I claim is:

1. A conductive polyurethane foam consisting essentially of an isocyanate containing component reacted with an active hydrogen containing component and one or more conductive fillers, wherein the one or more conductive fillers are present in an amount from about 40 parts by weight to about 150 parts by weight so as to provide EMI/RFI shielding.

2. The conductive polyurethane foam of claim 1 wherein the isocyanate containing component is selected from the group consisting of isocyanates and isocyanate terminated polyols; the active hydrogen containing component is selected from the group consisting of water, alcohols, amines, amine polyols, polyether polyols, polyester polyols, polymerized castor oils, hydroxyl terminated butadienes, and mixtures thereof; and the one or more conductive fillers are selected from the group consisting of noble metals, base metals, noble metal coated non noble metals, noble metal plated glass, noble metal plated plastics, noble metal plated ceramics and carbon black.

3. The conductive polyurethane foam of claim 1 wherein the one or more conductive fillers is silver flake.

4. The conductive polyurethane foam of claim 1 wherein the foam has a durometer of from about 8 to about 80 (Shore A hardness), a volume resistivity of from about 0.0017 to about 9.5 ohms.cm., and a surface resistivity of from about 0.07 to about 6.5 ohms/cm$^2$.

5. The conductive polyurethane foam of claim 2 wherein the isocyanate containing components is an isocyanate terminated polyol and the one or more conductive fillers are present in an amount from about 60 parts by weight per 100 parts by weight of polyol to about 85 parts by weight per 100 parts by weight of polyol.

6. The conductive polyurethane foam of claim 1 further comprising a catalyst, a surfactant, and a foam stabilizer.

7. The conductive polyurethane foam of claim 1 wherein the ratio of isocyanate containing component to active hydrogen containing component is from about 0.25:1 to about 1:0.25.

8. The conductive polyurethane foam of claim 1 wherein the isocyanate containing component is an isocyanate terminated polyether polyol, the active hydrogen containing component is water and the one or more conductive fillers is silver flake.

9. A conductive elastomeric foam consisting essentially of a polyurethane foam formed from an isocyanate terminated polyol prepolymer, an active hydrogen containing component and one or more electrically conductive fillers present in an amount sufficient to provide EMI/RFI shielding.

10. The conductive elastomeric foam of claim 9 wherein the isocyanate terminated polyol prepolymer is selected from the group consisting of isocyanate terminated polyester polyols and isocyanate terminated polyether polyols; the active hydrogen containing component is selected from the group consisting of water, alcohols, amines and mixtures thereof; and the one or more electrically conductive fillers are selected from the group consisting of noble metals, non-noble metals, noble metal plated non-noble metals, noble metal coated glass, noble metal coated plastics, noble metal coated ceramics, carbon black and mixtures thereof.

11. The conducitve elastomeric foam of claim 9 wherein the ratio of isocyanate groups in the isocyanate terminated polyol prepolymer to active hydrogen groups in the active hydrogen containing component is about 0.6:1, and the amount of one or more electrically conductive fillers is from about 40 parts by weight per 100 parts by weight of polyol to about 95 parts by weight per 100 parts by weight of polyol.

12. A conductive polyurethane foam system for use in EMI/RFI shielding applications comprising an isocyanate containing component, an active hydrogen containing component and one or more electrically conductive fillers, wherein the electrically conductive fillers are dispersed within the active hydrogen component before the isocyanate and active hydrogen components are mixed, wherein the fillers are present in an amount sufficient to provide EMI/RFI shielding.

13. The conductive polyurethane foam of claim 12 wherein the isocyanate containing component is selected from the group consisting of polyisocyanates and isocyanate terminated polyol prepolymers; the active hydrogen containing component is selected from the group consisting of water, alcohols, polyester polyols, polyether polyols, amine polyols, hydroxyl terminated butadienes, polymerized castor oils and mixtures thereof; and the one or more electrically conductive fillers is selected from the group consistingof noble metals, non noble metals, noble metal plated non noble metals, noble metal coated glass, noble metal coated plastics, noble metal coated ceramics, carbon black and mixtures thereof.

14. A conductive elastomeric form consisting essentially of a polyurethane foam formed from a reaction between an isocyanate terminated polyether polyol and an active hydrogen containing component selected from the group consisting of water, alcohols, amines and mixtures thereof, and one or more conductive fillers present in an amount from about 40 to about 150 parts by weight per 100 parts of polyol, said filler being dispersed throughout the polyurethane foam so as to provide a volume resistivity of less than 10 ohms cm and a surface resistivity of less than 7 ohms/cm$^2$.

15. The conductive foam of claim 14 wherein the one or more electrically conductive fillers is selected from the group consisting of noble metals, non noble metals, noble metal plated non noble metals, noble metal coated glass, noble metal coated plastics, noble metal coated ceramics, carbon black and mixtures thereof and wherein the one or more conductive fillers are dispersed within the active hydrogen containing component before the active hdyrogen containing component is reacted with the isocyanate terminated polyether polyl to form the polyurethane foam.

16. A process for filling a gap between conductive surfaces for EMI/RFI shielding applications comprising the steps of reacting an isocyanate containing component with an active hydrogen containing component having one or more conductive fillers therein in an amount sufficient to provide EMI/RFI shielding properties, placing the reacting components within the gap and allowing the reacting components to complete the reaction foam and cure.

17. The process of claim 16 wherein the product of the reaction is a conductive polyurethane foam having a volume resistivity of less than 9.5 ohms.cm and a surface resistivity of less than 6.5 ohms/cm$^2$.

18. The process of claim 16 wherein the reaction between the isocyanate containing component and the active hydrogen containing component is at about room temperature.

19. The process of claim 16 wherein the isocyanate containing component is selected from the group consisting of aromatic polyisocyanates, aliphatic polyisocyanates, cycloaliphatic polyisocyanates, polyisocyanate terminated polyols and mixtures thereof; the active hydrogen containing component is selected from water, alcohols, polyether polyols, polyester polyols, amines, amine polyols, and mixtures thereof; and the one or more conductive fillers are selected from the group consisting of noble metals, non noble metals, noble metal plated metals, noble metal coated glass, noble metal coated plastics, noble metal coated ceramics and carbon black.

20. The process of claim 19 wherein the isocyanate containing component is an isocyanate terminated polyol, the hydroxyl containing component is water and the conductive filler is silver flake.

21. A conductive polyurethane foam comprising an isocyanate terminated polyether polyol component reacted with an active hydrogen containing component and one or more conductive fillers in an amount sufficient to provide EMI/RFI shielding.

22. The conductive polyurethane foam of claim 21 wherein the active hydrogen containing component is selected from the group consisting of water, alcohols, amines, amine polyols, polymerized castor oils, hydroxyl terminated butadienes and mixtures thereof; the one or more conductive fillers are selected from the group consisting of noble metals, base metals, noble metal coated base metals, noble metal plated glass, noble metal plated plastics, noble metal plated ceramics, carbon black and mixtures thereof.

23. The conductive polyurethane foam of claim 21 wherein the foam has a volume resistivity of from about 0.0017 to about 9.5 ohms.cm and a surface resistivity of from about 0.07 to about 6.5 ohms/cm$^2$.

24. A polyurethane foam comprising an isocyanate terminated polyether polyol reacted with water and a silver flake conductive filler, wherein the foam has a surface resistivity of less than 7 ohms/cm$^2$ and is capable of providing EMI/RFI shielding properties.

* * * * *

REEXAMINATION CERTIFICATE (4164th)

United States Patent [19]
Morgan

[11] B1 4,931,479
[45] Certificate Issued  Oct. 10, 2000

[54] FOAM IN PLACE CONDUCTIVE POLYURETHANE FOAM

[75] Inventor: Noredin H. Morgan, Billerica, Mass.

[73] Assignee: Parker Intangibles Inc., Wilmington, Del.

Reexamination Request:
No. 90/005,325, Apr. 9, 1999

Reexamination Certificate for:
Patent No.: 4,931,479
Issued: Jun. 5, 1990
Appl. No.: 07/267,599
Filed: Nov. 7, 1988

[51] Int. Cl.[7] ............................... C08J 9/00
[52] U.S. Cl. ................ 521/76; 521/92; 521/99; 521/137; 521/155; 521/159; 521/170; 521/172; 521/173; 521/174; 252/512; 252/514
[58] Field of Search ................. 521/76, 92, 99, 521/137, 155, 159, 170, 172, 173, 174; 252/512, 514

[56] References Cited

U.S. PATENT DOCUMENTS

| | | |
|---|---|---|
| 2,796,457 | 6/1957 | Stinger . |
| 3,126,440 | 3/1964 | Goodloe . |
| 3,140,342 | 7/1964 | Ehrreich et al. . |
| 3,194,860 | 7/1965 | Ehrreich et al. . |
| 3,609,104 | 9/1971 | Ehrreich et al. . |
| 3,737,169 | 6/1973 | Glynn . |
| 3,752,899 | 8/1973 | Bakker . |
| 3,880,627 | 4/1975 | Morton . |
| 3,889,043 | 6/1975 | Ducros . |
| 4,011,360 | 3/1977 | Walsh . |
| 4,037,009 | 7/1977 | Severinsen . |
| 4,295,573 | 10/1981 | Terry et al. . |
| 4,352,712 | 10/1982 | Paul . |
| 4,378,322 | 3/1983 | Atterbury et al. . |
| 4,434,541 | 3/1984 | Powers, Jr. . |
| 4,507,359 | 3/1985 | Powers, Jr. . |
| 4,643,863 | 2/1987 | Martini . |
| 4,643,864 | 2/1987 | Martini . |
| 4,643,924 | 2/1987 | Uken et al. . |
| 4,650,387 | 3/1987 | Busch . |
| 4,664,971 | 5/1987 | Soens . |
| 4,678,716 | 7/1987 | Tzeng . |
| 4,690,831 | 9/1987 | Uken et al. . |
| 4,734,140 | 3/1988 | Tzeng . |
| 4,769,280 | 9/1988 | Powers, Jr. . |
| 4,779,762 | 10/1988 | Klein et al. . |
| 4,857,668 | 8/1989 | Buonanno . |

FOREIGN PATENT DOCUMENTS

| | | |
|---|---|---|
| 1116650 | 1/1982 | Canada . |
| 0 182 391 A2 | 5/1986 | European Pat. Off. . |
| 0 200 296 | 12/1986 | European Pat. Off. . |
| 0 241 192 A2 | 10/1987 | European Pat. Off. . |
| 51-76353 | 7/1976 | Japan . |
| 55-89336 | 7/1980 | Japan . |
| 61-235417 | 10/1986 | Japan . |
| 2 115 084 | 9/1983 | United Kingdom . |

OTHER PUBLICATIONS

J. H. Saunders et al., "Polyurethanes Chemistry and Technology" (Parts I & II), Robert E. Krieger Publishing Co., Huntington, NY (Reprint 1978 (original Ed. 1962)), pp. 73–76.

E. N. Doyle, "The Development and Use of Polyurethane Products", McGraw–Hill Book Co. (1971) pp. 28–41, 48–51, 170, 181, 232–257, and 290.

Toshiba Review, vol. 37, No. 3, pp. 259–262, dated 1982 entitled Silicone Formed–In–Place Gasket.

Elektro Technik article dated Nov. 4, 1987 entitled Foam–Sealed—Application of Binary Polyurethane Foam Seals (see English translation attached).

Pages from Chomerics' Cho–Bond–Cho–Shield Catalog copyrighted 1979.

Technical Bulletin 46 entitled Cho–Bond 1038 One Component Conductive Silicone RTV Adhesive/Sealant, copyrighted 1987.

*Primary Examiner*—J. Cooney

[57] ABSTRACT

An electrically conductive elastomeric foam for use in EMI/RFI shielding applications, especially as a gap filler or caulk. The foam is based upon a polyurethane system wherein the electrically conductive filler is intermixed with either the isocyanate or active hydrogen containing component before reacting the two components to create the foam. The foam is lightweight, flexible, highly conductive, capable of withstanding cyclical vibration and is capable of adhering to various conductive surfaces such as metal, composites and glass. The foam is preferably room temperature curable and consists of a water activable prepolymer or quasi prepolymer system.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–15 and 21–24 are cancelled.

Claim 16 is determined to be patentable as amended.

Claims 17–20, dependent on an amended claim, are determined to be patentable.

New claims 25–45 are added and determined to be patentable.

16. A process for filling a gap between conductive surfaces for EMI/RFI shielding applications *with an elastomeric, conductive polyurethane foam having a durometer of from about 8 to about 80 Shore A hardness* comprising the steps of reacting an isocyanate containing component with an active hydrogen containing component having one or more conductive fillers therein in an amount *from about 40 parts by weight to about 150 parts by weight* sufficient to provide EMI/RFI shielding properties, placing the reacting components within the gap and allowing the reacting components to complete the reaction [foam], *self-foam,* and cure to form said conductive polyurethane foam.

25. *The process of claim 16 wherein said foam adheres to a surface of said gap.*

26. *An elastomeric, conductive polyurethane foam having a durometer of from about 8 to about 80 Shore A hardness consisting essentially of an isocyanate containing component reacted with an active hydrogen containing component; and one or more conductive filers, wherein the one or more conductive fillers are present in an amount from about 40 parts by weight to about 150 parts by weight so as to provide EMI/RFI shielding wherein said elastomeric, conductive polyurethane foam is prepared in place on a conductive surface, the surface forming a gap when placed adjoining another conductive surface, which gap is filled by said foam for EMI/RFI shielding by a process comprising the steps of:*

(a) *placing a reactive mixture on the surface, the mixture comprising the isocyanate component, the active hydrogen containing component, and the one or more conductive fillers;*

(b) *self-foaming the reactive mixture on the surface;*

(c) *curing the reactive mixture to form said foam in place on said surface; and*

(d) *placing the resultant foamed surface against said another conductive surface.*

27. *The product of claim 26 wherein the isocyanate containing component is selected from the group consisting of isocyanates and isocyanate terminated polyols; the active hydrogen containing component is selected from the group consisting of water, alcohols, amines, amine polyols, polyether polyols, polyester polyols, polymerized castor oils, hydroxyl terminated butadienes, and mixtures thereof; and the one or more conductive fillers are selected from the group consisting of noble metals, base metals, noble metal coated non noble metals, noble metal plated glass, noble metal plated plastics, noble metal plated ceramics and carbon black.*

28. *The product of claim 26 wherein the one or more conductive fillers is silver flake.*

29. *The product of claim 26 wherein the foam formed in step (c) has a volume resistivity of from about 0.0017 to about 9.5 ohms.cm., and a surface resistivity of from about 0.07 to about 6.5 ohms/cm$^2$.*

30. *The product of claim 27 wherein the isocyanate containing component is an isocyanate terminated polyol and the one or more conductive fillers are present in an amount from about 60 parts by weight per 100 parts by weight of polyol to about 85 parts by weight per 100 parts by weight of polyol.*

31. *The product of claim 26 wherein the reactive mixture provided in step (a) further consists essentially of a catalyst, a surfactant, and a foam stabilizer.*

32. *The product of claim 26 wherein the ratio of isocyanate containing component to active hydrogen containing component is from about 0.25:1 to about 1:0.25.*

33. *The product of claim 26 wherein the isocyanate containing component is an isocyanate terminated polyether polyol, the active hydrogen containing component is water and the one or more conductive fillers is silver flake.*

34. *The product of claim 26 wherein the isocyanate containing component is an isocyanate terminated polyol prepolymer.*

35. *The product of claim 34 wherein the isocyanate terminated polyol prepolymer is selected from the group consisting of isocyanate terminated polyester polyols and isocyanate terminated polyether polyols; the active hydrogen containing component is selected from the group consisting of water, alcohols, amines and mixtures thereof; and the one or more electrically conductive fillers are selected from the group consisting of noble metals, non-noble metals, noble metal plated non-noble metals, noble metal coated glass, noble metal coated plastics, noble metal coated ceramics, carbon black and mixtures thereof.*

36. *The product of claim 34 wherein the ratio of isocyanate groups in the isocyanate terminated polyol prepolymer to active hydrogen groups in the active hydrogen containing component is about 0.6:1, and the amount of one or more electrically conductive fillers is from about 40 parts by weight per 100 parts by weight of polyol to about 95 parts by weight per 100 parts by weight of polyol.*

37. *The product of claim 26 wherein the electrically conductive fillers are dispersed within the active hydrogen component before the isocyanate and active hydrogen components are mixed.*

38. *The product of claim 37 wherein the isocyanate containing component is selected from the group consisting of polyisocyanates and isocyanate terminated polyol prepolymers; the active hydrogen containing component is selected from the group consisting of water, alcohols, polyester polyols, polyether polyols, amine polyols, hydroxyl terminated butadienes, polymerized castor oils and mixtures thereof; and the one or more electrically conductive fillers is selected from the group consisting of noble metals, non noble metals, noble metal plated non noble metals, noble metal coated glass, noble metal coated plastics, noble metal coated ceramics, carbon black and mixtures thereof.*

39. *The product of claim 26 wherein the isocyanate containing component is an isocyanate terminated polyether polyol, the active hydrogen containing component is* selected from the group consisting of water, alcohols, amines and mixtures thereof, and said filler is dispersed throughout the polyurethane foam so as to provide a volume resistivity of less than 10 ohms cm and a surface resistivity of less than 7 ohms/cm$^2$.

40. The product of claim 39 wherein the one or more electrically conductive fillers is selected from the group consisting of noble metals, non noble metals, noble metal plated non noble metals, noble metal coated glass, noble metal coated plastics, noble metal coated ceramics, carbon black and mixtures thereof and wherein the one or more conductive fillers are dispersed within the active hydrogen containing component before the active hydrogen containing component is reacted with the isocyanate terminated polyether polyol to form the polyurethane foam.

41. The product of claim 26 wherein the isocyanate containing component is an isocyanate terminated polyether polyol.

42. The product of claim 41 wherein the active hydrogen containing component is selected from the group consisting of water, alcohols, amines, amine polyols, polymerized castor oils, hydroxyl terminated butadienes and mixtures thereof; the one or more conductive fillers are selected from the group consisting of noble metals, base metals, noble metal coated base metals, noble metal plated glass, noble metal plated plastics, noble metal plated ceramics, carbon black and mixtures thereof.

43. The product of claim 41 wherein the foam formed in step (c) has a volume resistivity of from about 0.0017 to about 9.5 ohms.cm and a surface resistivity of from about 0.07 to about 6.5 ohms/cm$^2$.

44. The product of claim 26 wherein said isocyanate containing component is an isocyanate terminated polyether polyol, said active hydrogen containing component is water and said filler is silver flake, and wherein the foam has a surface resistivity of less than 7 ohms/cm$^2$.

45. The product of claim 26 wherein the foam formed in step (c) adheres to said surface.

* * * * *